(12) United States Patent
Lee et al.

(10) Patent No.: US 11,817,475 B2
(45) Date of Patent: Nov. 14, 2023

(54) SEMICONDUCTOR DEVICE AND SEMICONDUCTOR APPARATUS INCLUDING THE SAME

(71) Applicant: Samsung Electronics Co., Ltd., Suwon-si (KR)

(72) Inventors: Jaeho Lee, Seoul (KR); Yong-Hee Cho, Suwon-si (KR); Seungwoo Jang, Suwon-si (KR); Younggeun Park, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 251 days.

(21) Appl. No.: 17/465,223

(22) Filed: Sep. 2, 2021

(65) Prior Publication Data

US 2022/0173209 A1 Jun. 2, 2022

(30) Foreign Application Priority Data

Nov. 27, 2020 (KR) .................. 10-2020-0163330
Mar. 16, 2021 (KR) .................. 10-2021-0034245

(51) Int. Cl.
*H01L 29/792* (2006.01)
*H01L 49/02* (2006.01)

(52) U.S. Cl.
CPC .............. *H01L 28/55* (2013.01); *H01L 28/65* (2013.01); *H01L 29/792* (2013.01)

(58) Field of Classification Search
CPC ....... H01L 28/55; H01L 28/65; H01L 29/792; H01L 27/016; H01L 28/40; H01L 28/90;
(Continued)

(56) References Cited

U.S. PATENT DOCUMENTS 7,508,649 B2      3/2009  Kwon et al.
2003/0224218 A1*  12/2003 Manchanda .......... H01L 29/518
                                                        428/472
(Continued)

FOREIGN PATENT DOCUMENTS

CN    108751981 A    11/2018
KR    10-0703966 B1   4/2007
(Continued)

OTHER PUBLICATIONS

M. Rahman et al., "Characterization of Al Incorporation into HfO2 Dielectric by Atomic Layer Deposition," Micromachines, 2019, 10, 361, May 30, 2016.
(Continued)

*Primary Examiner* — David Vu
(74) *Attorney, Agent, or Firm* — HARNESS, DICKEY & PIERCE, P.L.C.

(57) ABSTRACT

A semiconductor device includes a first electrode; a second electrode which is apart from the first electrode; and a dielectric layer between the first electrode and the second electrode. The dielectric layer may include a base material including an oxide of a base metal, the base material having a dielectric constant of about 20 to about 70, and co-dopants including a Group 3 element and a Group 5 element. The Group 3 element may include Sc, Y, B, Al, Ga, In, and/or Tl, and the Group 5 element may include V, Nb, Ta, N, P, As, Sb, and/or Bi.

20 Claims, 11 Drawing Sheets

(58) Field of Classification Search
CPC ...... H01G 4/1218; H01G 4/008; H01G 4/012; H01G 4/085; H01G 4/1209; H01G 4/1236; H01G 4/40; H01G 4/33; H01G 4/30; H10B 12/0335; H10B 12/315
See application file for complete search history.

(56) References Cited

U.S. PATENT DOCUMENTS

| | | |
|---|---|---|
| 2004/0164416 A1 | 8/2004 | Sakashita |
| 2013/0071988 A1 | 3/2013 | Deweerd et al. |
| 2014/0183695 A1 | 7/2014 | Malhotra et al. |
| 2015/0187865 A1 | 7/2015 | Barabash et al. |
| 2020/0243531 A1 | 7/2020 | Ahn et al. |
| 2020/0286985 A1 | 9/2020 | Lim et al. |
| 2021/0043749 A1 | 2/2021 | Lee et al. |
| 2021/0115564 A1 | 4/2021 | Park et al. |
| 2021/0183993 A1 | 6/2021 | Kim et al. |
| 2021/0273039 A1 | 9/2021 | Kim et al. |

FOREIGN PATENT DOCUMENTS

| | | |
|---|---|---|
| KR | 10-2017-0136826 A | 12/2017 |
| KR | 10-2020-0033010 A | 3/2020 |
| KR | 10-2021-0047591 A | 4/2021 |
| KR | 10-2021-0075727 A | 6/2021 |

OTHER PUBLICATIONS

Ali Wen et al., "Electrical and Dielectric Properties of Aluminum/Niobium Co-doped $CaCu_3Ti_4O_{12}$ Ceramics," Ferroelectrics, 492:1, Feb. 17, 2016.

L. Khomenkova et al., "The peculiarities of structural and optical properties of $HfO_2$-based films co-doped with silicon and erbium," Applied Surface Sciences, 471 (2019), pp. 521-527, Dec. 1, 2018.

Extended European Search Report dated Apr. 8, 2022 in European Patent Application No. 21202221.4.

* cited by examiner

SEMICONDUCTOR DEVICE AND SEMICONDUCTOR APPARATUS INCLUDING THE SAME

CROSS-REFERENCE TO RELATED APPLICATIONS

This application is based on and claims priority under 35 U.S.C. § 119 to Korean Patent Application No. 10-2020-0163330, filed on Nov. 27, 2020, in the Korean Intellectual Property Office, and Korean Patent Application No. 10-2021-0034245, filed on Mar. 16, 2021, in the Korean Intellectual Property Office, the disclosures of each of which are incorporated by reference herein in their entirety.

BACKGROUND

1. Field

The present disclosure relates to a semiconductor device and a semiconductor apparatus including the semiconductor device.

2. Description of the Related Art

Along with the downscaling of electronic devices, the space for semiconductor devices is also decreasing in an electronic device. Therefore, semiconductor devices such as capacitors are required to have a small size and a thin dielectric layer as well. In this case, however, a large amount of leakage current may flow through the dielectric layers of capacitors, and thus, it may be difficult to drive devices.

SUMMARY

Provided are dielectric layers having high permittivity and low current leakage, semiconductor devices including the dielectric layers, and semiconductor apparatuses including the semiconductor devices.

Additional aspects will be set forth in part in the description that follows and, in part, will be apparent from the description, or may be learned by practice of the presented embodiments of the disclosure.

According to an aspect of an embodiment, a semiconductor device may include a first electrode; a second electrode which is apart from the first electrode; and a dielectric layer between the first electrode and the second electrode, the dielectric layer including a base material including an oxide of a base metal, the base material may have a dielectric constant of about 20 to about 70, and co-dopants including a Group 3 element and a Group 5 element.

The base material may include at least one of Hf, Zr, Pr, Nd, Gd, Dy, Yb, Pb, Zn, Ti, or Lu.

The Group 3 element may include at least one of Sc, Y, B, Al, Ga, In, and/or Tl, and/or the Group 5 element may include at least one of V, Nb, Ta, N, P, As, Sb, and/or Bi. The Group 3 element and/or the Group 5 element may include d-orbitals. For example, the Group 3 element may include Sc and/or Y, and/or the Group 5 element may include V, Nb, and/or Ta.

In the dielectric layer, the Group 3 element and the Group 5 element may exist as dopant pairs, such that the Group 3 element and the Group 5 element share an oxygen atom. In addition, the dielectric layer may include two or more such dopant pairs, and the distance between the two dopant pairs may be less than or equal to about 6 times the ionic radius of the base metal.

The dopants (co-dopants) including the Group 3 element and the Group 5 element may have substitutional formation energy of less than about 0 for the base material.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
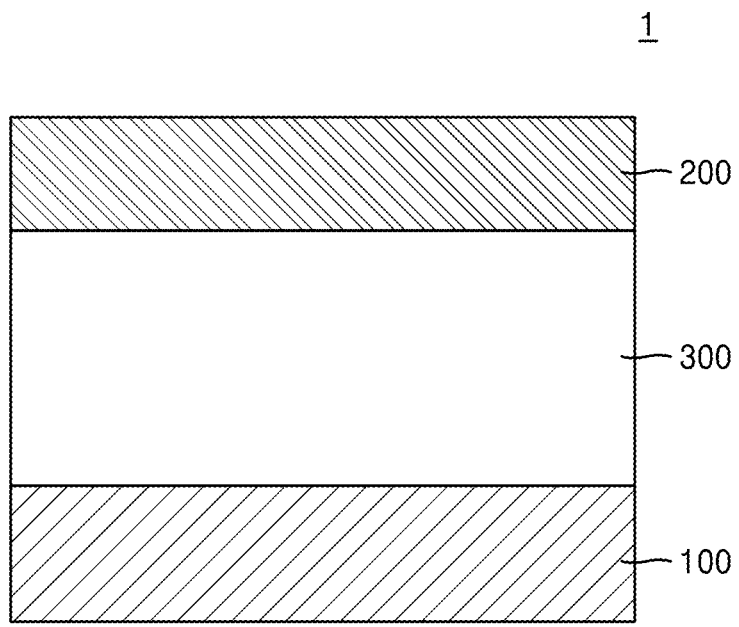
FIG. 1 is a schematic view illustrating a semiconductor device according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, terms are used only for explaining specific embodiments while not limiting the scope of the present disclosure. When an element is referred to as being "above" or "on" another element, it may be directly on an upper, lower, left, or right side of the other element while making contact with the other element or may be above an upper, lower, left, or right side of the other element without making contact with the other element.

The terms of a singular form may include plural forms unless otherwise mentioned. Unless otherwise mentioned, the terms "comprises" and/or "comprising" used herein specify the presence of stated features, numbers, steps, processes, elements, components, materials, or combinations thereof but do not preclude the presence or addition of one or more other features, numbers, steps, processes, elements, components, materials, or combinations thereof.

Although terms such as "first," "second," and "third" are used to describe various elements, the terms are only used to distinguish one element from other elements, and the features of the elements such as order and type should not be limited by the terms. In addition, terms such as "unit," "means," "module," or "part" may be used to denote a unit of a comprehensive structure that has a certain function or operation, and may be implemented with hardware, software, and/or a combination of hardware and software.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described with reference to the accompanying drawings. In the drawings, like reference numerals refer to like elements, and the sizes of elements (such as the widths and thicknesses of layers or regions) may be exaggerated for clarity of illustration. The embodiments described herein are for illustrative purposes only, and various modifications may be made therein.

According to an aspect, a semiconductor device having low current leakage and improved electric capacity may be provided. The semiconductor device may be a capacitor.

FIG. 1 is a schematic view illustrating a capacitor 1 according to an embodiment. Referring to FIG. 1, the capacitor 1 may include a first electrode 100, a second electrode 200 which is apart from the first electrode 100, and a dielectric layer 300 which is between the first electrode 100 and the second electrode 200.

The first electrode 100 may be arranged on a substrate (not shown). The substrate may be a portion of a structure supporting the capacitor 1 and/or a portion of a device connected to the capacitor 1. The substrate may include a semiconductor material pattern, an insulating material pattern, and/or a conductive material pattern. For example, as described later with reference to FIGS. 5 and 6, the substrate may include a substrate 11', gate stacks 12, an interlayer insulating layer 15, contact structures 20', and/or bit line structures 13. In addition, for example, the substrate may include a semiconductor material such as silicon (Si), germanium (Ge), silicon germanium (SiGe), silicon carbide (SiC), gallium arsenide (GaAs), indium arsenide (InAs), and/or indium phosphide (InP), and/or may include an insulating material such as silicon oxide, silicon nitride, and/or silicon oxynitride.

The second electrode 200 may be apart from the first electrode 100 while facing the second electrode 200. The first electrode 100 and/or the second electrode 200 may each independently include a conductive material such as a metal, a metal nitride, a metal oxide, and/or a combination thereof. For example, the first electrode 100 and/or the second electrode 200 may each independently include: a metal such as ruthenium (Ru), titanium (Ti), tantalum (Ta), niobium (Nb), iridium (Ir), molybdenum (Mo), tungsten (W), and/or platinum (Pt); a conductive metal nitride such as titanium nitride (TiN), tantalum nitride (TaN), niobium nitride (NbN), molybdenum nitride (MoN), cobalt nitride (CoN), and/or tungsten nitride (WN); and/or a conductive metal oxide such as platinum oxide (PtO), iridium oxide ($IrO_2$), ruthenium oxide ($RuO_2$), strontium ruthenium oxide ($SrRuO_3$), barium strontium ruthenium oxide ($(Ba,Sr)RuO_3$), calcium ruthenium oxide ($CaRuO_3$), and/or lanthanum strontium cobalt oxide ($(La,Sr)CoO_3$).

In some example embodiments, the first electrode 100 and/or the second electrode 200 may each independently include a metal nitride represented by MM'N. M refers to a metal element, M' refers to an element different from M, and N refers to nitrogen. For example, the metal nitride may include a metal nitride MN doped with an element M'. M may include at least one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and/or U. M' may include at least one of H, Li, As, Se, N, O, P, S, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U. When the composition ratio of M, M', and N in the metal nitride MM'N is denoted as x':y':z' (e.g., $M_{x'}M'_{y'}N_{z'}$), $0 \le x' \le 2$, $0 \le y' \le 2$, $0 < z' \le 4$, and one of x' and y' may not be zero.

The first electrode 100 and/or the second electrode 200 may each independently have a single material-layer structure and/or a stack structure in which a plurality of material layers are stacked. For example, in some embodiments, the first electrode 100 and/or the second electrode 200 may each independently be a single layer of titanium nitride (TiN) or a single layer of niobium nitride (NbN). Alternatively, the first electrode 100 and/or the second electrode 200 may each independently have a stack structure including a first electrode layer including titanium nitride (TiN) and a second electrode layer including niobium nitride (NbN).

The dielectric layer 300 may include a metal oxide having a dielectric constant of about 20 to about 70 as a base material, and may include a Group 3 element and a Group 5 element as dopants.

The base material may be a metal oxide including at least one of Hf, Zr, Pr, Nd, Gd, Dy, Yb, Pb, Zn, Ti, and/or Lu. For example, the base material may include hafnium oxide ($HfO_2$), hafnium silicon oxide ($HfSiO_4$), zirconium oxide ($ZrO_2$), hafnium zirconium oxide ($HfZrO_2$), zirconium silicon oxide ($ZrSiO_4$), titanium oxide ($TiO_2$), strontium titanium oxide, ($SrTiO_3$), and/or the like. In addition, the base material may include a metal oxynitride such as aluminum oxynitride (AlON), zirconium oxynitride (ZrON), and/or hafnium oxynitride (HfON); a silicate such as ZrSiON and/or HfSiON; and/or an aluminate such as ZrAlON and/or HfAlON. The dielectric layer 300 may include crystal grains with tetragonal, monoclinic, and/or orthorhombic crystalline phase. In some embodiments, the base material may include crystals with a tetragonal crystal lattice. For example, lattice structure of the base material may be, under ambient temperatures and/or pressures, primarily tetragonal.

A Group 3 element and a Group 5 element may be used together as co-dopants for the base material. Such co-dopants may increase the permittivity of the dielectric layer 300 by changing the electrical characteristics of the dielectric layer 300 without impairing the chemical stability of the base material. For example, a base material containing $ZrO_2$ has a tetravalent cation, and co-dopants including a Group 3 element and a Group 5 element may match the stoichiometry of the base material and may thus improve the chemical stability of the dielectric layer 300.

According to some embodiments, the Group 3 element may include at least of Sc, Y, B, Al, Ga, In, and/or Tl, and the Group 5 element may include at least one of V, Nb, Ta, N, P, As, Sb, and/or Bi.

The metal of the base material, the Group 3 element, and/or the Group 5 element may be included in the dielectric layer 300 in appropriate amounts according to the permittivity of the dielectric layer 300, the leakage current of the capacitor 1, and the like. For example, the content of the metal of the base metal in the dielectric layer 300, compared to the co-dopants, may be about 80 at % or more, about 85 at % or more, about 90 at % or more, about 92 at % or more, about 94 at % or more, and/or about 95 at % or more; and/or about 100 at % or less, about 98 at % or less, and/or about 96 at % or less. In addition, the total content of the co-dopants in the dielectric layer 300, for example, the total content of the Group 3 element and the Group 5 element in the dielectric layer 300 may be about 0.0 at % or more, about 0.5 at % or more, about 1.0 at % or more, about 1.5 at % or more, about 2.0 at % or more, and/or about 3.0 at % or more; and/or about 20.0 at % or less, about 15.0 at % or less, about 13.0 at % or less, about 10.0 at % or less, about 5.0 at % or less, about 4.0 at % or less, about 3.5 at % or less, and/or about 3.0 at % or less, based on, for example, the total metal content in the dielectric layer 300. The content ratio of the Group 3 element and the Group 5 element is not limited, but may be about 1:10 to about 10:1, and for example, the content of the Group 3 element and the content of the Group 5 element may be equal to each other (1:1).

For example, the dielectric layer 300 may include a compound represented by $(A,B)_xC_yO_z$ (where A refers to a Group 3 element, B refers to a Group 5 element, C refers to at least one of Hf, Zr, Pr, Nd, Gd, Dy, Yb, Pb, Zn, Ti, and/or Lu, x+y+z=1, 0<x≤0.2, and 0<y≤0.5). The total content (x) of the element A and the element B may be greater than about 0.0, greater than or equal to about 0.001, greater than or equal to about 0.005, greater than or equal to about 0.01, greater than or equal to about 0.015, and/or greater than or equal to about 0.02; and/or less than or equal to about 0.2, less than or equal to about 0.18, and/or less than or equal to about 0.15. The content (y) of the element C may be greater than about 0.0, greater than or equal to about 0.05, greater than or equal to about 0.10, greater than or equal to about 0.15, greater than or equal to about 0.18, greater than or equal to about 0.20, and/or greater than or equal to about 0.22; and/or less than or equal to about 0.50, less than or equal to 0.45, less than or equal to 0.40, and/or less than or equal to 0.35.

The co-dopants including the Group 3 element and the Group 5 element may have substitutional formation energy of less than zero (0) for the base material. The amount of this substitutional formation energy of the co-dopants may have an effect on the chemical stability of a material.

According to some embodiments, at least one of the Group 3 element and/or the Group 5 element may have d-orbitals. The energy band gap of the base material may affect the leakage current of the dielectric layer 300. For example, the metal element of the base metal (such as $ZrO_2$) may have d-orbitals and p-orbitals, and the energy band gap thereof may be reduced by orbital hybridization, causing current leakage through the dielectric layer 300. The Group 3 element and/or the Group 5 element, which have d-orbitals, may interact with the d-orbitals and/or p-orbitals of the metal element of the base material, increasing the energy band gap of the metal element and reducing current leakage through the dielectric layer 300. Table 1 shows the results of calculation of the energy band gap of a dielectric layer, which includes $ZrO_2$ as an example base material and Group 3 and 5 elements as co-dopants. Referring to Table 1, the Group 3 element and/or the Group 5 element, which have d-orbitals, may increase the energy band gap of the dielectric layer by about 3% or more, about 10% or more, about 15% or more, or about 20% or more.

TABLE 1

| Base material | Dopants | Eg (eV) | ΔEg (%) |
| --- | --- | --- | --- |
| $ZrO_2$ | Sc—Nb | 3.997 | 103.5 |
| $ZrO_2$ | Y—Nb | 4.447 | 115.2 |
| $ZrO_2$ | Y—Ta | 5.018 | 130.0 |
| $ZrO_2$ | – | 3.86 | 100.0 |

In some embodiments, the d-orbitals of the Group 3 element and/or the Group 5 element may not be fully filled with electrons. For example, the Group 3 element may include at least one of Sc and/or Y, and/or the Group 5 element may include at least one of V, Nb, and/or Ta.

Figure 2A:
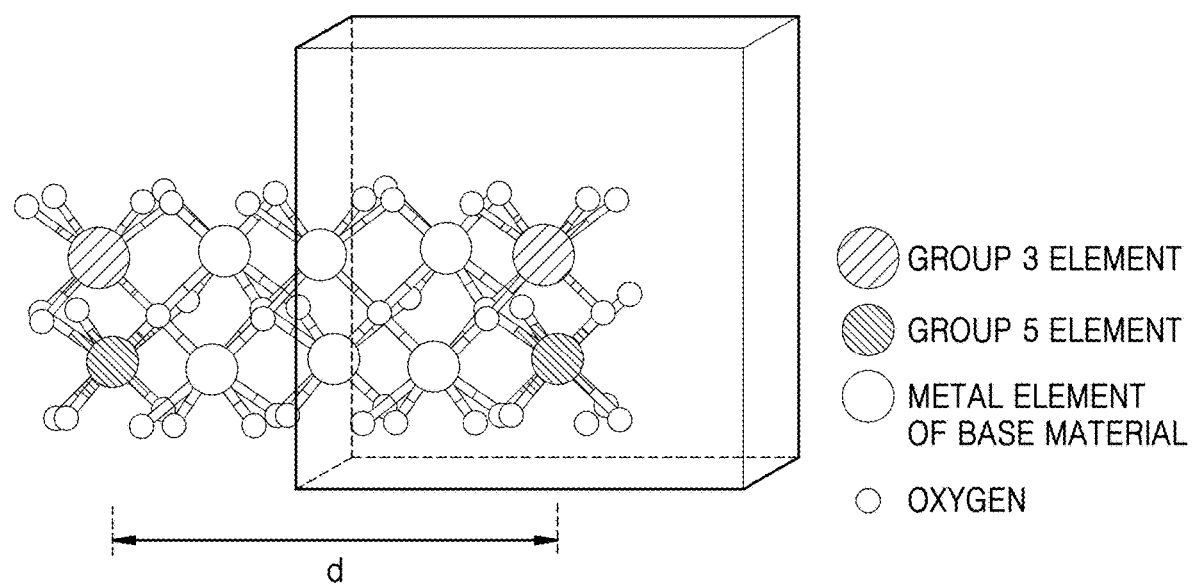
FIGS. 2A and 2B are schematic views illustrating atomic arrangement structures of dielectric layers according to some example embodiments.
Figure 2B:
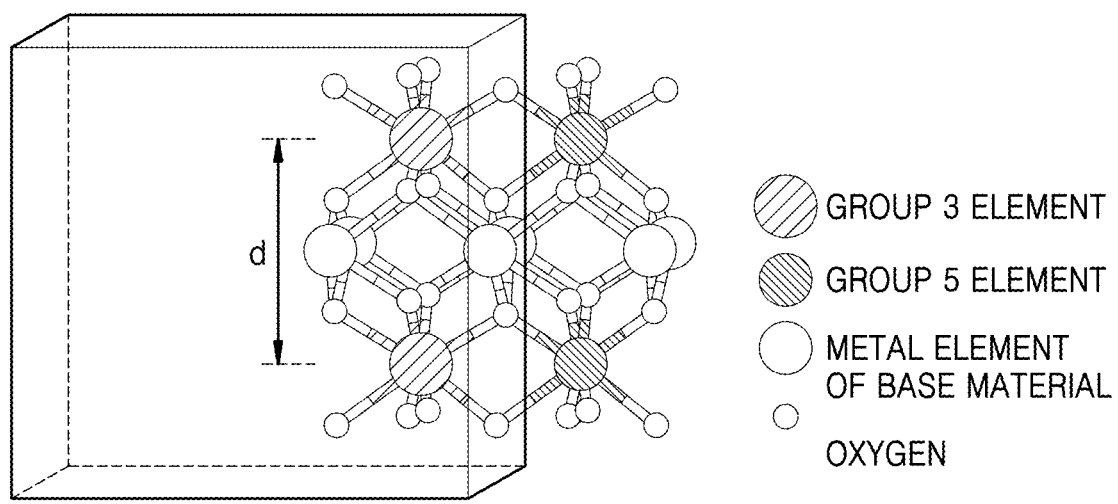

The Group 3 element and/or the Group 5 element may be variously positioned in the dielectric layer 300 without limitations. In some embodiments, the Group 3 element and the Group 5 element may be arranged close to each other. For example, as shown in FIGS. 2A and 2B, some of the Group 3 elements and the Group 5 elements may share oxygen atoms, thereby forming dopant pairs. When the Group 3 element and the Group 5 element form dopant pairs, the Group 3 element and the Group 5 element may have relatively low substitutional formation energy for the base material compared to the case in which the Group 3 element and the Group 5 element have no dopant pairs, and thus, the stability of the dielectric layer 300 may increase.

In addition, two or more dopant pairs of the Group 3 element and the Group 5 element may be included in the dielectric layer 300. The base metal may be arranged between two dopant pairs, and the distance (d) between two dopant pairs may be equal to or less than 6 times, 5 times, 4 times, and/or 3 times the ionic radius of the metal of the base material. FIGS. 2A and 2B are schematic views illustrating atomic arrangement structures having different distances between two dopant pairs.

Table 2 shows the results of calculation of the substitutional formation energy and dielectric constants of dielectric layers having the same dopant pairs and atomic arrangement structures shown in FIGS. 2A and 2B. In Table 2, the content of dopants is about 6.25 at % based on the total metal content in the dielectric layers. Referring to Table 2, when the distance (d) between two dopant pairs is equal to or less than 6 times the ionic radius of the metal of the base material, a relatively large dielectric constant increase and relatively low substitutional formation energy are obtained, and thus, a more stable dielectric layer is obtained.

TABLE 2

| | Distance between dopant pairs | Substitutional formation energy (eV) | ΔDielectric constant (%) |
| --- | --- | --- | --- |
| FIG. 2A | more than 6 times the ionic radius of the metal of the base metal | −0.379 | 106% |
| FIG. 2B | equal to less than 6 times the ionic radius of the metal of the base metal | −0.630 | 122% |
| — | No dopant | – | 100% |

The permittivity (dielectric constant) of the dielectric layer 300 may be greater than the permittivity of the base material by about 10% or more, about 12% or more, 15% or more, about 18% or more, and/or about 20% or more. In addition, the dielectric constant of the dielectric layer 300 may be about 40 or more, about 42 or more, and/or about 45 or more.

The dielectric layer 300 may have a thickness of about 20 Å to about 100 Å. For example, the dielectric layer 300 may have a thickness of about 25 Å or more, about 30 Å or more, and/or about 35 Å or more; and/or about 90 Å or less, about 80 Å or less, about 70 Å or less, and/or about 60 Å or less.

The capacitor 1 may further include an interfacial layer (not shown) between the first electrode 100 and the dielectric layer 300 and/or an interfacial layer (not shown) between the second electrode 200 and the dielectric layer 300. The interfacial layer(s) may function as barrier layer(s), which may prevent and/or mitigate the diffusion and/or movement of impurities between the first electrode 100 and the dielectric layer 300 and/or between the second electrode 200 and the dielectric layer 300. For example, the interfacial layers may prevent some atoms (for example, nitrogen atoms) included in the first and second electrodes 100 and 200 from permeating into the dielectric layer 300 and some atoms (for example, oxygen atoms) included in the dielectric layer 300 from diffusing into the first and second electrodes 100 and 200.

In some embodiments, the interfacial layers may include a transition metal oxide having electrical conductivity. For example, the interfacial layers may include at least one of a metal oxide (such as titanium oxide, tantalum oxide, niobium oxide, and/or molybdenum oxide); and/or a metal oxynitride (such as titanium oxynitride (TiON), tantalum oxynitride (TaON), niobium oxynitride (NbON), and/or molybdenum oxynitride (MoON)). In some embodiments, the interfacial layers may include an oxide of a metal included in the first electrode 100 and/or the second electrode 200. For example, wherein the first electrode 100 includes a metal nitride represented by MM'N, and the interfacial layer between the first electrode 100 and the dielectric layer 300 may include a metal oxynitride represented by MM'ON. Each of the interfacial layers may have a thickness that is not sufficient for the interfacial layer to function as a dielectric layer. For example, the interfacial layer may, in some embodiments, not be thick enough to prevent and/or reliably mitigate quantum tunneling; and/or may have a thickness of about 1 Å to about 10 Å.

According to some example embodiments, a semiconductor device (for example, the capacitor 1) may be manufactured by forming the first electrode 100 on the substrate, the dielectric layer 300 (having a given (or otherwise determined) composition and thickness) on the first electrode 100, and the second electrode 200 on the dielectric layer 300. The first electrode 100, the dielectric layer 300, and the second electrode 200 may be formed through methods known in the art. For example, each of the first electrode 100, the dielectric layer 300, and the second electrode 200 may be independently formed by a deposition method such as an atomic layer deposition (ALD) method, a chemical vapor deposition (CVD) method, a physical vapor deposition (PVD) method, and/or a sputtering method. Among the listed methods, the ALD method enables the formation of a uniform layer in layer thickness units of a single atom at a relatively low temperature.

For example, one or more deposition cycles each independently including supplying a metal precursor, purging the metal precursor, supplying a reaction gas (for example, an oxygen and/or nitrogen source), and purging the reaction gas may be performed to form the dielectric layer 300.

The dielectric layer 300 may be formed by supplying a precursor of the metal of the base material, a precursor of the 3 Group element, a precursor of the 5 Group element, and an oxygen source to the first electrode 100, and the composition, fraction, and/or thickness of the dielectric layer 300 may be controlled by adjusting, for example, the supply order, times, and/or amounts of the precursors and the oxygen source. For example, the precursor of the metal of the base material, the precursor of the Group 3 element, the precursor of the Group 5 element, and/or the oxygen source may be supplied to the first electrode 100 simultaneously or intermittently in a given order. For example, two or more of the precursor of the metal of the base material, the precursor of the Group 3 element, the precursor of the Group 5 element, and/or the oxygen source may be simultaneously supplied to the first electrode 100 through two or more injection holes; or the first metal precursor, the second metal precursor, the third metal precursor, and the oxygen source may be sequentially supplied to the first electrode 100.

The metal precursors may include the precursor of the metal of the base material, the precursor of the Group 3 element, and/or the precursor of the Group 5 element, and may each independently include a metal organic compound represented by $AR_n$, $BR_{n'}$, or $CR_{n''}$. A may refer to the metal element of the base material; B may refer to the Group 3 element; C may refer to the Group 5 element; R may refer to at least one selected from the group consisting of a $C_1$ to $C_{10}$ alkyl group, a $C_2$ to $C_{10}$ alkenyl group, a carbonyl group (C=O), a halide, a $C_6$ to $C_{10}$ aryl group, a $C_6$ to $C_{10}$ cycloalkyl group, a $C_6$ to $C_{10}$ cycloalkenyl group, (C=O)R (R refers to hydrogen or a $C_1$ to $C_{10}$ alkyl group), a $C_1$ to $C_{10}$ alkoxy group, a $C_1$ to $C_{10}$ amidinate, a $C_1$ to $C_{10}$ alkylamide, a $C_1$ to $C_{10}$ alkylimide, —N(Q)(Q') (Q and Q' each independently refer to a $C_1$ to $C_{10}$ alkyl group or hydrogen), Q(C=O)CN (Q refers to hydrogen or a $C_1$ to $C_{10}$ alkyl group), and/or a $C_1$ to $C_{10}$ β-diketonate; and n, n', and/or n'' may each be greater than 0 but less than or equal to 6.

In some embodiments, $O_3$, $H_2O$, $O_2$, $N_2O$, $O_2$, and/or plasma may be used as the oxygen source. Heat treatment may be performed on the dielectric layer 300. For example, heat treatment may be performed after the dielectric layer 300 and/or the second electrode 200 are formed. During the heat treatment, metal elements in the dielectric layer 300 may be materially diffused, some or all of the metal oxides in the dielectric layer 300 may be crystallized, and/or the size of crystal grains may increase.

The heat treatment may be performed at a temperature of about 400° C. to about 1100° C., but is not limited thereto. The heat treatment may be performed for about 1 nanosecond or more, about 1 micro-second or more, about 0.001 second or more, about 0.01 second or more, about 0.05 second or more, about 0.1 second or more, about 0.5 second or more, about 1 second or more, about 3 seconds or more, and/or about 5 seconds or more, and/or about 10 minutes or less, about 5 minutes or less, about 1 minute or less, and/or 30 seconds or less, but is not limited thereto.

After the metal precursors and the reaction gas (for example, an oxidizing agent) are supplied to the substrate or the dielectric layer 300, remaining metal precursors and/or reaction gas, which have not undergone reaction, and/or by-products thereof may be removed by purging. An inert gas such as Ar, He, or Ne, and/or $N_2$ gas may be used for the purging.

The interfacial layer (not shown) may be formed on the first electrode 100 after the first electrode 100 is formed, or on the dielectric layer 300 after the dielectric layer 300 is formed. The interfacial layer may be formed by providing a precursor and/or a source of an element forming the interfacial layer to the first electrode 100 or the dielectric layer 300. Alternatively, the interfacial layer may be formed by oxidizing a portion of the surface of the first electrode 100 by providing an oxygen source to the first electrode 100.

Figure 9:
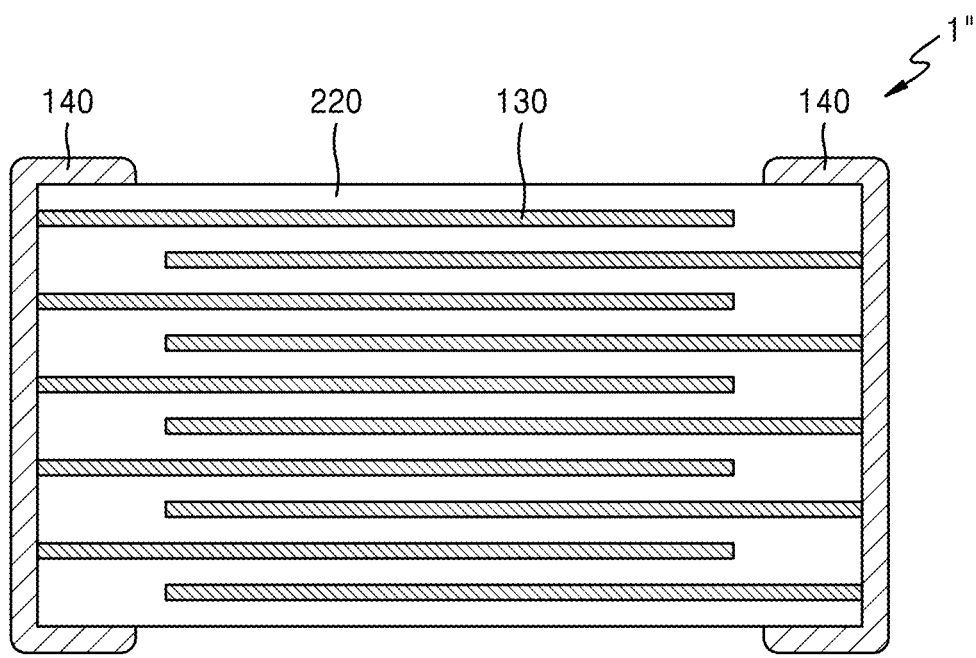
FIG. 9 is a schematic view of a multi-layered ceramic capacitor (MLCC) according to some embodiments.

FIG. 9 is a schematic view of a multi-layered ceramic capacitor (MLCC) according to some embodiments.

Referring to FIG. 9, a multi-layered capacitor 1" according to some example embodiments may include a plurality of internal electrodes 130 and a dielectric material layer 220 alternately disposed between the plurality of internal electrodes 130. The multi-layered capacitor 1" may have a structure in which the plurality of internal electrodes 130 and the dielectric material layer 220 are alternately stacked. The plurality of internal electrodes 130 may be substantially the same as the first electrode 100 and/or the second electrode 200 described above. The dielectric material layer 220 may be substantially the same as the dielectric layer 300 described above.

The adjacent internal electrodes 130 may be electrically separated from one another by the dielectric material layer 220 therebetween. The multi-layered capacitor 1" may act as a single unit capacitor. In the multi-layered capacitor 1", the number of the internal electrodes 130 and the number of the dielectric material layers 220, which are alternately stacked, may each independently be, for example, 2 or greater, 5 or greater, 10 or greater, 20 or greater, 50 or greater, 100 or greater, 200 or greater, 500 or greater, 1,000 or greater, 2,000 or greater, 5,000 or greater, or 10,000 or greater. As the number of the stacked internal electrodes 130 and the dielectric material layer 220 increases, a contact area thereof may increase, thus improving the capacitance.

The plurality of internal electrodes 130, which are alternately stacked may partially protrude in the directions of opposing side surfaces of the multi-layered capacitor 1, and/or may be electrically connected to external electrodes 140. The external electrodes 140 may include, for example, an electrode layer contacting the multi-layered structure (e.g., electrically connected to the internal electrodes 130), and may comprise, for example, a conductive material (e.g., a metal such as Cu and/or Ni) and/or a plating layer on the electrode layer.

The multi-layer capacitor 1", according to one or more embodiments may include a dielectric with Group 3 and Group 5 co-dopants. In this regard, a dielectric layer of the multi-layer capacitor 1" may have improved stability and/or permittivity characteristic. Thus, the multi-layer capacitor 1" may also have improved capacitance characteristics.

According to another aspect, a semiconductor apparatus may be provided. The semiconductor apparatus may have memory characteristics, and may include, for example, a DRAM. In addition, the semiconductor apparatus may have a structure in which a transistor and a capacitor are electrically connected to each other, and the capacitor may be at least one of the semiconductor devices described above.

Figure 3:
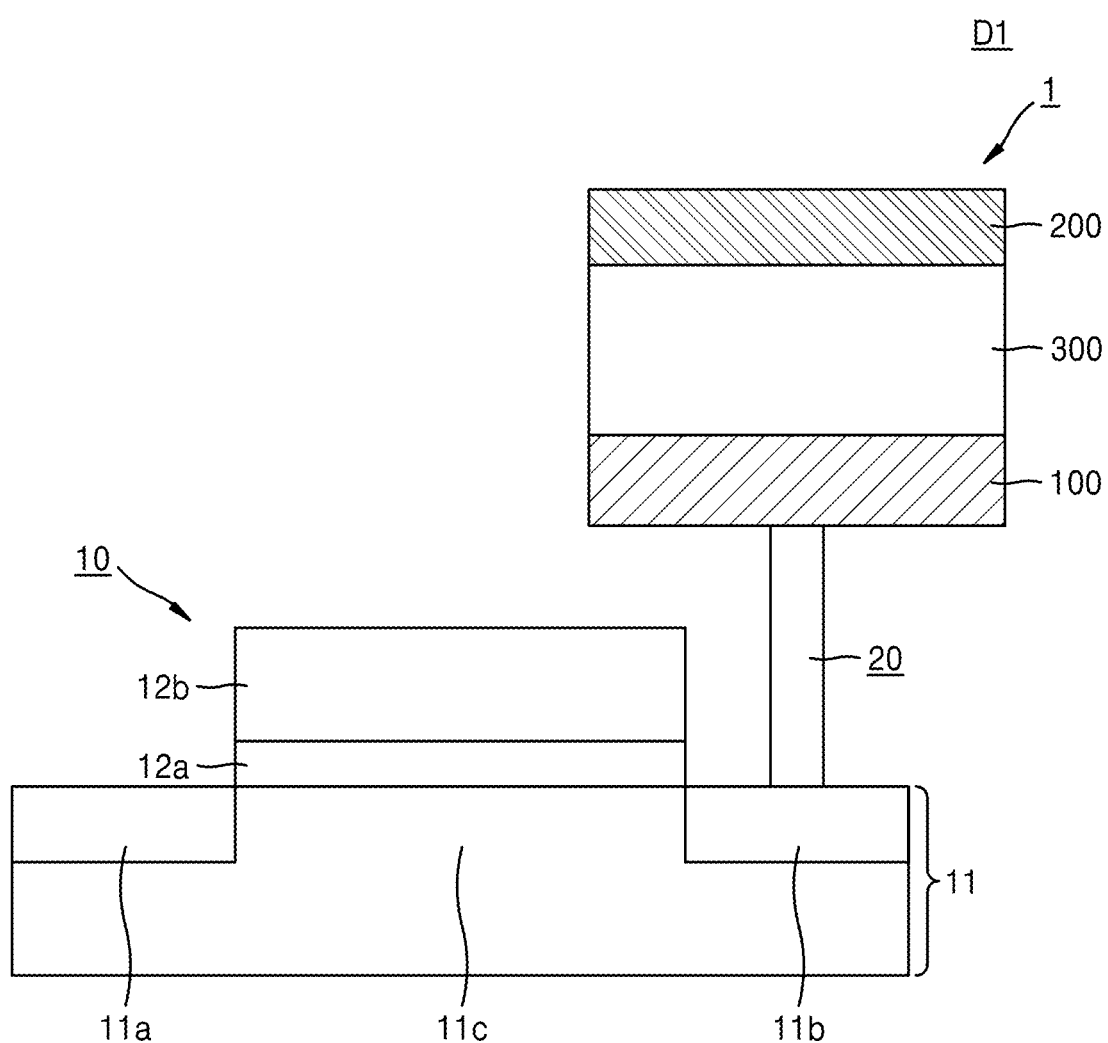
FIG. 3 is a schematic view illustrating a semiconductor apparatus according to some example embodiments.

FIG. 3 is a schematic view illustrating a semiconductor apparatus D1 (connection structure between a capacitor and a transistor (e.g., a field effect transistor 10)) according to some embodiments. Referring to FIG. 3, the semiconductor apparatus D1 may have a structure in which a capacitor (e.g., the capacitor 1 including the dielectric layer 300) is electrically connected to a transistor (e.g., field effect transistor 10) through a contact 20. For example, one of the first and second electrodes 100 and 200 of the capacitor 1 may be electrically connected to one of a source 11a and a drain 11b of the field effect transistor 10 through the contact 20.

However, the semiconductor apparatus D1 is not limited thereto. For example, in some embodiments, the capacitor 1 may be directly connected to the field effect transistor 10; the capacitor 1 may share an electrode with the field effect transistor 10; and/or the contact 20 may be and/or may be included in at least one of the first electrode 100, second electrode 200, the source 11a, and/or the drain 11b. In the semiconductor apparatus D1 the capacitor may be considered a charge storage device and may be configured to be in a charged and/or discharged state.

The field effect transistor 10 may include a substrate 11 and a gate electrode 12b facing a channel 11c. A gate insulating layer 12a may be further included between the substrate 11 and the gate electrode 12b.

The substrate 11 may include a semiconductor material. For example, the substrate 11 may include a semiconductor material such as silicon (Si), germanium (Ge), silicon germanium (SiGe), silicon carbide (SiC), gallium arsenide (GaAs), indium arsenide (InAs), and/or indium phosphide (InP), and/or may be modified into various forms such as silicon on insulator (SOI). For example, the channel 11c may include the semiconductor material.

The substrate 11 may include the source 11a, the drain 11b, and the channel 11c, which is electrically connected to (and/or between) the source 11a and the drain 11b. For example, the source 11a may be electrically connected to or in contact with one end of the channel 11c, and the drain 11b may be electrically connected to or in contact with the other end of the channel 11c. In some embodiments, the channel 11c may be defined as a region of the substrate 11 between the source 11a and the drain 11b.

The source 11a, the drain 11b, and the channel 11c may be independently formed by doping different regions of the substrate 11, and in this case, the source 11a, the channel 11c, and the drain 11b may include the material of the substrate 11 as a base material; and/or by transferring and/or depositing conductive and/or semiconductive materials onto the substrate 11.

For example, the channel 11c may be provided as a separate material layer (thin film) (not shown). In this case, for example, the channel 11c may include at least one of an oxide semiconductor, a nitride semiconductor, an oxynitride semiconductor, a two-dimensional (2D) material, quantum dots (QDs), and/or an organic semiconductor, a semiconductor material such as Si, Ge, SiGe, and/or a Group III-V material. For example, the oxide semiconductor may include InGaZnO, etc., the 2D material may include transition metal dichalcogenide (TMD) and/or graphene, and the QDs may include colloidal QDs and/or nanocrystal structures.

In some embodiments, the source 11a and the drain 11b may include a conductive material. For example, the source 11a and the drain 11b may each independently include a metal, a metal compound, and/or a conductive polymer. In some examples, the conductive material may be and/or may be include in a source and/or drain electrode.

The gate electrode 12b may be arranged above the substrate 11 and/or may face the channel 11c, at a distance, from the substrate 11. The gate electrode 12b may have a conductivity of about 1 Mohm/square or less. The gate electrode 12b may include a metal, a metal nitride, a metal carbide, and/or polysilicon. For example, the metal may include aluminum (Al), tungsten (W), molybdenum (Mo), titanium (Ti), and/or tantalum (Ta), and the metal nitride may include titanium nitride (TiN) and/or tantalum nitride (TaN). The metal carbide may include a metal carbide doped with (or containing) aluminum and/or silicon, and for example, the metal carbide may include TiAlC, TaAlC, TiSiC, and/or TaSiC. The gate electrode 12b may have a stack structure in which a plurality of materials are stacked, for example, a stack structure of metal nitride layer/metal layer such as TiN/Al or a stack structure of metal nitride layer/metal carbide layer/metal layer such as TiN/TiAlC/W. The gate electrode 12b may include titanium nitride (TiN) and/or molybdenum (Mo), and/or may be used in various forms modified from the examples described above.

The gate insulating layer 12a may be arranged between the substrate 11 and the gate electrode 12b. The gate insulating layer 12a may include a paraelectric material and/or a high-k dielectric material and may have a dielectric constant of 20 to 70. The gate insulating layer 12a may include silicon oxide, silicon nitride, aluminum oxide, hafnium oxide, zirconium oxide, or the like, and/or may include a 2D insulator such as hexagonal boron nitride (h-BN). For example, the gate insulating layer 12a may include silicon oxide ($SiO_2$), silicon nitride ($SiN_x$), and/or the like, and/or may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), and/or the like. In addition, the gate insulating layer 12a may include: a metal oxynitride such as aluminum oxynitride (AlON), zirconium oxynitride (ZrON), hafnium oxynitride (HfON), lanthanum oxynitride (LaON), and/or yttrium oxynitride (YON); a silicate such as ZrSiON, HfSiON, YSiON, and/or LaSiON; and/r or an aluminate such as ZrAlON and/or HfAlON. In some embodiments, the gate insulating layer 12a may include the dielectric layer 300 described above. The gate insulating layer 12a may form a gate stack together with the gate electrode 12b.

The contact 20 may include a suitable conductive material such as tungsten, copper, aluminum, and/or polysilicon.

The arrangement of the capacitor 1 and the field effect transistor 10 may be variously modified. For example, the capacitor 1 may be arranged on the substrate 11 or may be buried in the substrate 11.

FIG. 3 schematically illustrates the semiconductor apparatus D1 having the capacitor 1 and the field effect transistor 10. However, as shown in FIG. 4, a semiconductor apparatus D10 may have a structure in which a plurality of capacitors 1' and a plurality of field effect transistors are repeatedly arranged.

Figure 4:
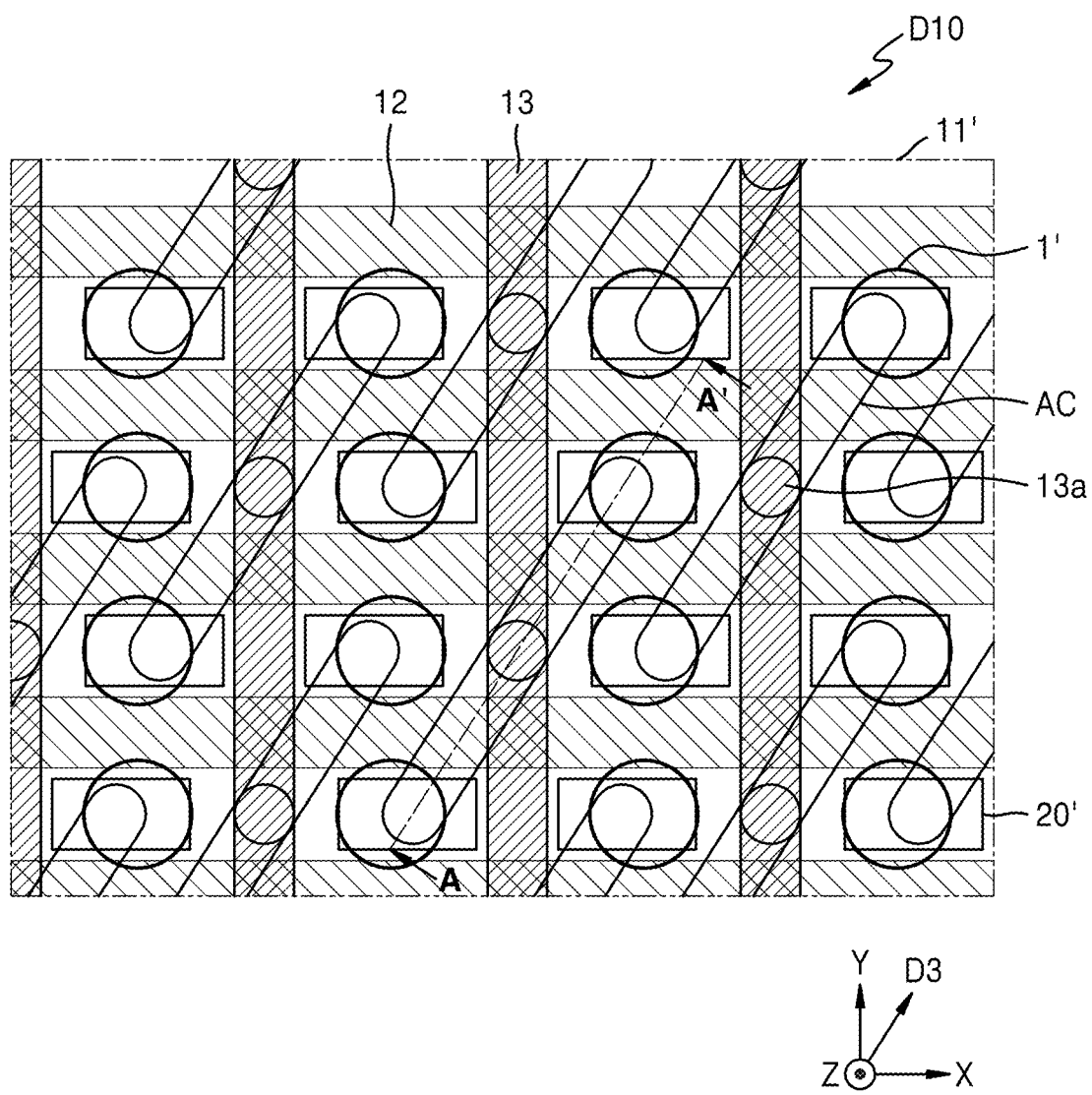
FIG. 4 is a layout view illustrating a semiconductor apparatus according to some example embodiments.

Referring to FIG. 4, the semiconductor apparatus D10 may include the field effect transistors including gate stacks 12 and a substrate 11', which has sources, drains, and channels; contact structures 20' arranged on the substrate 11' without overlapping the gate stacks 12; and the capacitors 1' arranged on the contact structures 20'. The semiconductor apparatus D10 may further include bit line structures 13, which electrically connect the field effect transistors to each other. FIG. 4 illustrates the semiconductor apparatus D10 in which the contact structures 20' and the capacitors 1' are repeatedly arranged in X and Y directions, but this is a non-limiting example. For example, the contact structures 20' may be arranged in the X and Y directions, and the capacitors 1' may be arranged in a hexagonal shape such as a honeycomb structure.

Figure 5:
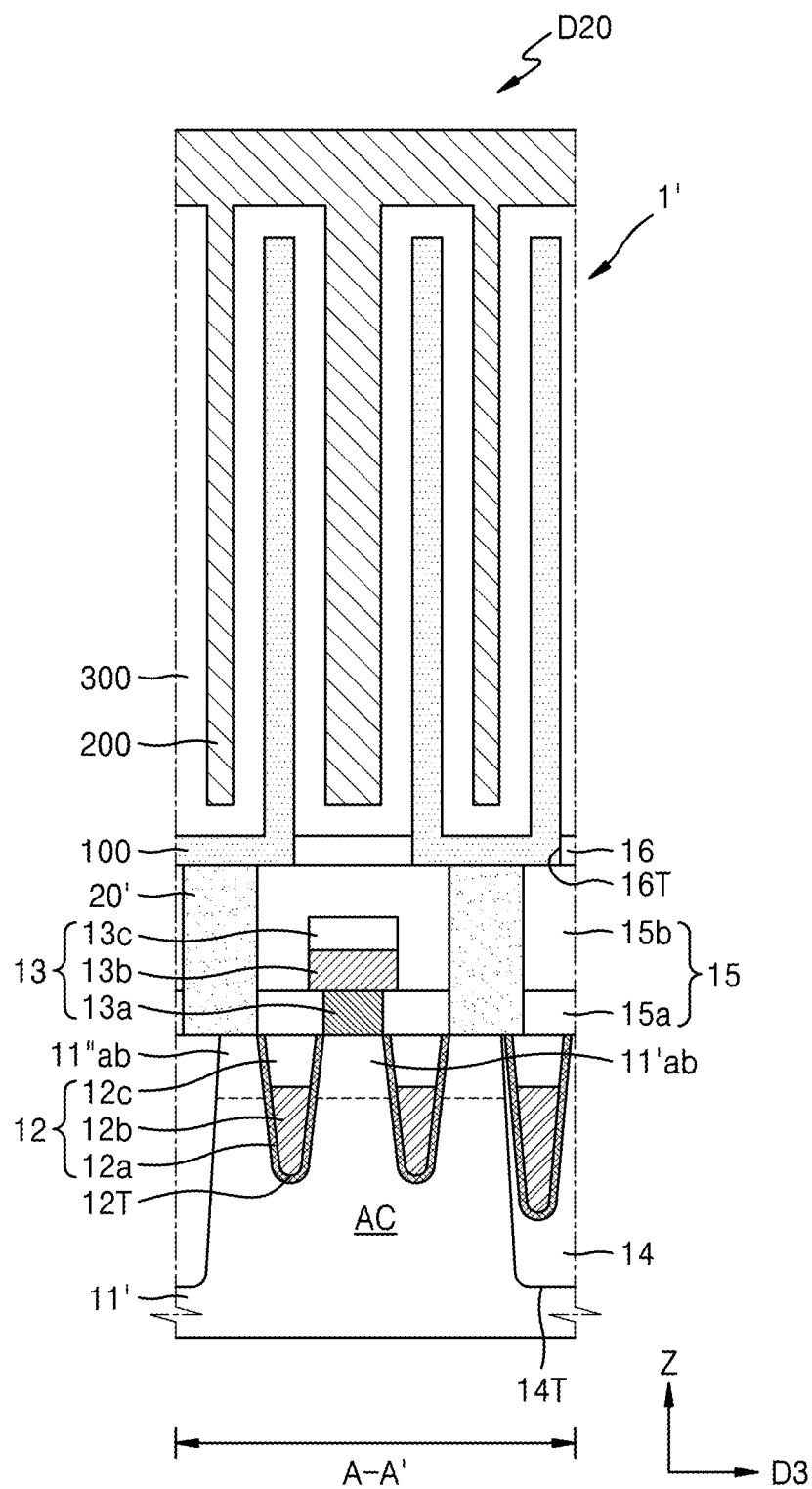
FIGS. 5 and 6 are cross-sectional views of the semiconductor device shown in FIG. 4, which are taken along line A-A' of FIG. 4.

FIG. 5 is a cross-sectional view taken along line A-A of FIG. 4 to show an example structure of the semiconductor apparatus D10. Referring to FIG. 5, the substrate 11' may have a shallow trench isolation (STI) structure including a device isolation layer 14. The device isolation layer 14 may be a single layer including a single type of insulating layer, or may have a multilayer structure including a combination of two or more types of insulating layers. The device isolation layer 14 may include a device isolation trench 14T in the substrate 11', and the device isolation trench 14T may be filled with an insulating material. The insulation material may include, but is not limited thereto, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and/or a polysilazane (e.g., tonen silazane (TOSZ).

In addition, the substrate 11' may further include an active region AC, which is defined by the device isolation layer 14; and a gate line trench 12T, which may be arranged parallel to the upper surface of the substrate 11' and/or extend in the X direction. The active region AC may have a relatively long island shape having a short axis and a long axis. The long axis of the active region AC may be arranged in a direction D3 parallel to the upper surface of the substrate 11', as illustrated in FIG. 5. The gate line trench 12T may have a given (and/or otherwise determined) depth from the upper surface of the substrate 11' and may be arranged in the active region AC or across the active region AC. A gate line trench 12T may also be provided inside the device isolation trench 14T, and the gate line trench 12T provided inside the device isolation trench 14T may have a bottom lower than the bottom of the gate line trench 12T provided in the active region AC.

A first source/drain 11'ab and a second source/drain 11"ab may be arranged in upper portions of the active region AC at both sides of the gate line trench 12T.

A gate stack 12 may be arranged inside the gate line trench 12T. For example, a gate insulating layer 12a, a gate electrode 12b, and a gate capping layer 12c may be sequentially arranged inside the gate line trench 12T. The gate insulating layer 12a and the gate electrode 12b may be the same as those described above, and the gate capping layer 12c may include silicon oxide, silicon oxynitride, and/or silicon nitride. The gate capping layer 12c may be arranged on the gate electrode 12b to fill the remaining portion of the gate line trench 12T.

In addition, a bit line structure 13 may be arranged on the first source/drain 11'ab. The bit line structure 13 may be parallel to the upper surface of the substrate 11' and may extend in the Y direction. The bit line structure 13 may be electrically connected to the first source/drain 11'ab, and may include a bit line contact 13a, a bit line 13b, and/or a bit line capping layer 13c, which are sequentially formed on the substrate 11'. For example, the bit line contact 13a may include polysilicon, the bit line 13b may include a metallic material, and the bit line capping layer 13c may include an insulating material such as silicon nitride (SiN) and/or silicon oxynitride (SiON). FIG. 5 illustrates that the bit line contact 13a has a bottom surface at the same level as the upper surface of the substrate 11'. However, the bit line contact 13a may extend into a recess (not shown) formed to a predetermined (and/or otherwise desired) depth from the upper surface of the substrate 11' such that the bottom surface of the bit line contact 13a may be lower than the upper surface of the substrate 11'.

Optionally, the bit line structure 13 may include a bit line intermediate layer (not shown) between the bit line contact 13a and the bit line 13b. The bit line intermediate layer may include a metal silicide such as tungsten silicide and/or a metal nitride such as tungsten nitride. In addition, a bit line spacer (not shown) may be further formed on a sidewall of the bit line structure 13. The bit line spacer may have a single layer structure and/or a multilayer structure, and may include an insulating material such as silicon oxide, silicon oxynitride, and/or silicon nitride. In addition, the bit line spacer may further include an air space (not shown).

A contact structure 20' may be arranged on the second source/drain 11"ab. The contact structure 20' and the bit line structure 13 may be arranged on different source/drains in the substrate 11'. The contact structure 20' may have a structure in which a lower contact pattern (not shown), a metal silicide layer (not shown), and/or an upper contact pattern (not shown) are sequentially stacked on the second source/drain 11"ab. In addition, the contact structure 20' may further include a barrier layer (not shown), which surrounds at least one of the side and/or bottom surfaces of the upper contact pattern. In some embodiments, the lower contact pattern may include a conductive and/or semiconductive material (e.g., polysilicon), the upper contact pattern may include a conductive material (e.g., a metallic material), and/or the barrier layer may include a conductive material resistance to degradation and/or defect (and/or inclusion) diffusion (e.g., a conductive metal nitride).

A capacitor 1' may be electrically connected to the contact structure 20' and may be arranged above the substrate 11'. For example, the capacitor 1' has a first electrode 100 electrically connected to the contact structure 20', a dielectric layer 300 arranged on the first electrode 100, and a second electrode 200 arranged on the dielectric layer 300. The dielectric layer 300 may be arranged on the first electrode 100 in parallel to the surface of the first electrode 100.

An interlayer insulating layer 15 may be further arranged between the capacitor 1' and the substrate 11'. The interlayer insulating layer 15 may be arranged in spaces between the capacitor 1' and the substrate 11' in which no other structures are arranged. For example, the interlayer insulating layer 15 may cover wiring and/or electrode structures such as the bit line structure 13, the contact structure 20', and the gate stack 12, which are formed on or in the substrate 11'. For example, the interlayer insulating layer 15 may surround walls of the contact structure 20'. The interlayer insulating layer 15 may include a first interlayer insulating layer 15a, which surrounds the bit line contact 13a; and a second interlayer insulating layer 15b, which covers side surfaces and/or upper surfaces of the bit line 13b and the bit line capping layer 13c.

The first electrode 100 of the capacitor 1' may be arranged on the interlayer insulating layer 15 (for example, on the second interlayer insulating layer 15b of the interlayer insulating layer 15). In addition, when a plurality of capacitors 1' are arranged, bottom surfaces of a plurality of first electrodes 100 may be separated from each other by an etch stop layer 16. In other words, the etch stop layer 16 may include openings 16T, and the bottom surfaces of the first electrodes 100 of the capacitors 1' may be arranged in the openings 16T.

As shown in FIG. 5, the first electrode 100 may have a cylindrical shape or a cup shape with a closed bottom. In another example, as shown in FIG. 6, the first electrode 100 may have a pillar shape such as a circular pillar, a rectangular pillar, or a polygonal pillar, which extends in a vertical direction (Z direction).

In addition, the capacitor 1' may further include a support (not shown) that prevents the first electrode 100 from tilting or collapsing. For example, the support may be arranged on sidewalls of the first electrode 100.

Figure 6:
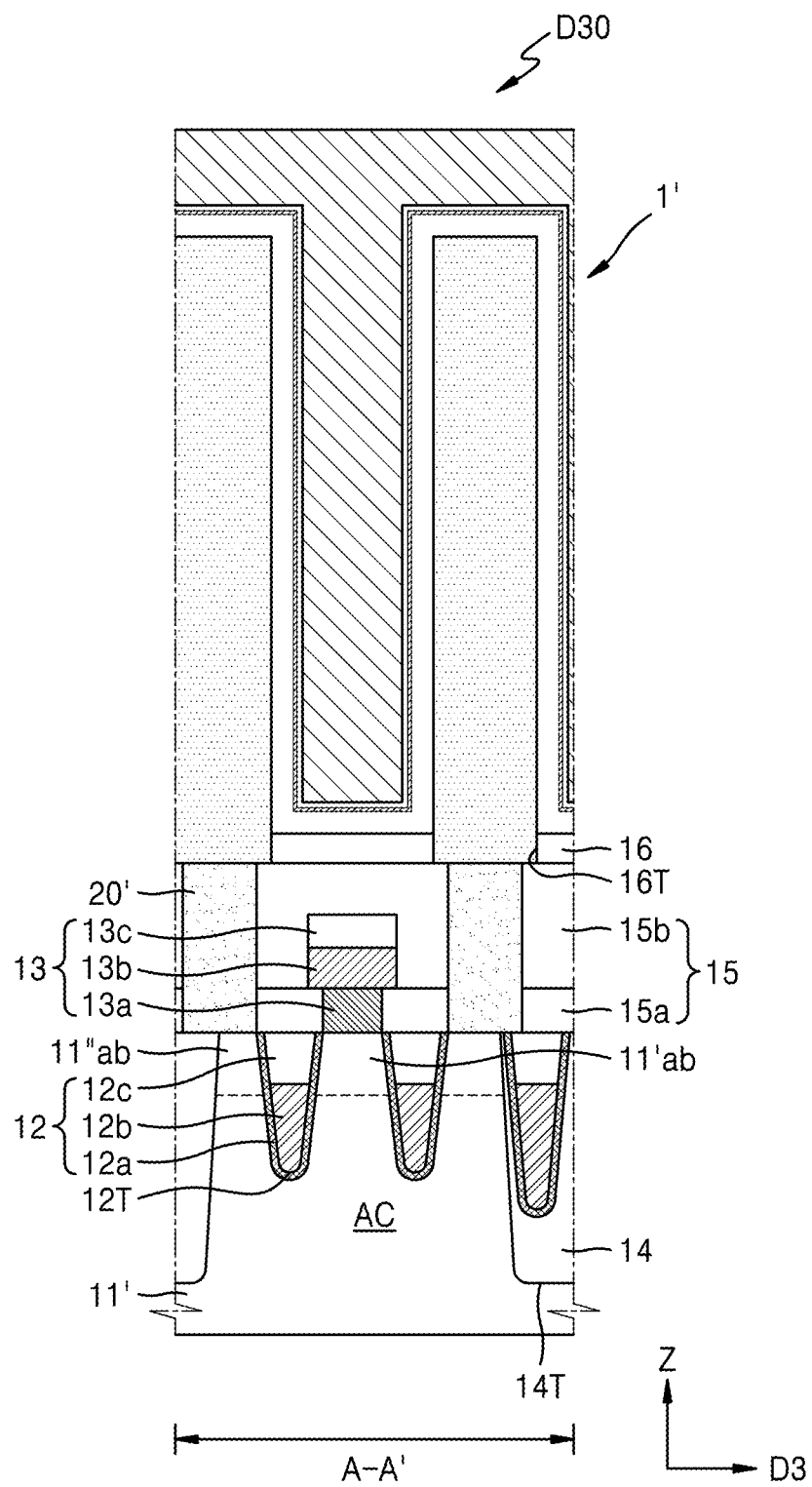

A semiconductor apparatus such as the semiconductor apparatuses D20 and D30 shown in FIGS. 5 and 6 may be manufactured by referring to a conventional method known in the art. For example, a semiconductor apparatus such as the semiconductor apparatuses D20 and D30 may be manufactured through operations including the following operations:

i) forming a device isolation trench 14T in a substrate 11', and forming a device isolation layer 14 in the device isolation trench 14T, (defining an active region AC in the substrate 11' by the device isolation layer 14 and/or the device isolation trench 14T);

ii) filling the inside of the device isolation trench 14T with an insulating material;

iii) forming a first source/drain 11'ab and a second source/drain 11"ab in an upper region of the active region AC by implanting dopant ions into the substrate 11';

iv) forming a gate line trench 12T in the substrate 11';

v) forming a gate insulating layer 12a, a gate electrode 12b, and a gate capping layer 12c inside the gate line trench 12T;

vi) forming a first interlayer insulating layer 15a on the substrate 11', and forming an opening (not shown) to expose the upper surface of the first source/drain 11'ab;

vii) forming a bit line structure 13 in the opening formed in operation vi such that the bit line structure 13 may be electrically connected to the first source/drain 11'ab;

viii) forming a second interlayer insulating layer 15b to cover upper and side surfaces of the bit line structure 13;

ix) forming an opening (not shown) in the first and second interlayer insulating layers 15a and 15b to expose the upper surface of the second source/drain 11"ab;

x) forming a contact structure 20' in the opening formed in operation ix such that the contact structure 20' may be electrically connected to the second source/drain 11"ab;

xi) forming an etch stop layer 16 and a mold layer (not shown) on the second interlayer insulating layer 15b and the contact structure 20';

xii) forming an opening (not shown) in the etch stop layer 16 and the mold layer (not shown) to expose the upper surface of the contact structure 20';

xiii) forming a first electrode 100 to cover the inner walls (e.g., bottom and side walls) of the opening formed in operation xii;

xiv) removing the mold layer (not shown);

xv) forming a dielectric layer 300 on the first electrode 100; and xvi) forming a second electrode 200 on the dielectric layer 300.

The types and/or order of the operations described above are not limited. The operations may be appropriately changed, and some operations may be omitted and/or added. In addition, processes known in the related art such as a deposition process, a patterning process, and/or an etching process may be used to form elements in the operations. For example, when forming an electrode, an etch-back process may be used. In operation v, the gate electrode 12b may be formed by forming a conductive layer on the gate insulating layer 12a and then removing an upper portion of the conductive layer by a predetermined height through an etch-back process. In addition, in operation xiii, the first electrode 100 may be formed by forming an electrode to cover the upper surface of the mold layer and the bottom and side surfaces of the opening, and then removing (e.g., through an etch-back process) a portion of the electrode formed on the upper surface of the mold layer. In this manner, a structure having a plurality of first electrodes 100 may be formed. In another example, a planarization process may be used. For example, in operation v, the gate capping layer 12c may be formed by filling the remaining portion of the gate line trench 12T with an insulating material, and then planarizing the insulating material until the upper surface of the substrate 11' is exposed.

The semiconductor devices and the semiconductor apparatuses may be applied to various electronic devices. For example, the semiconductor devices and the semiconductor apparatuses may be used as logic devices or memory devices in various electronic devices. For example, the semiconductor devices and the semiconductor apparatuses of the embodiments may be used for arithmetic operations, program execution, temporary data retention, or the like in electronic devices such as mobile devices, computers, laptop computers, sensors, network devices, neuromorphic devices, and/or the like. The semiconductor devices and the semiconductor apparatuses of the embodiments may be used in electronic devices that continuously transmit and receive data in large amounts.

Figure 7:
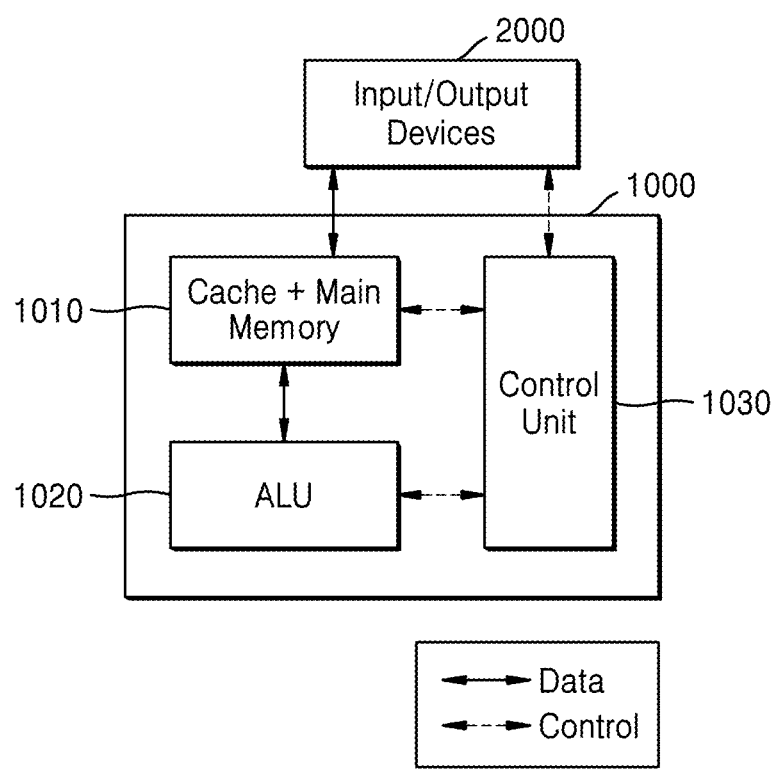
FIGS. 7 and 8 are conceptual views schematically illustrating device architectures applicable to electronic devices according to some example embodiments.
Figure 8:
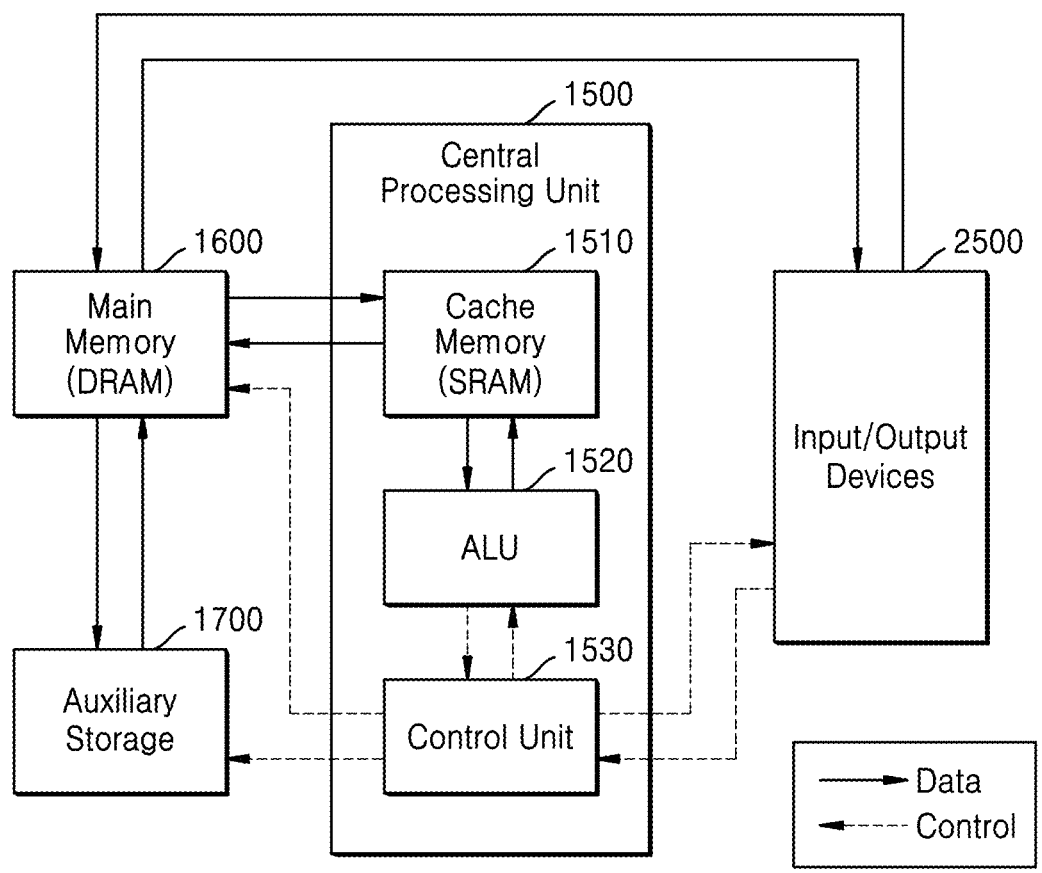

FIGS. 7 and 8 are conceptual views schematically illustrating electronic device architectures applicable to electronic devices according to embodiments.

Referring to FIG. 7, an electronic device architecture 1000 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1000 may be implemented as a single chip including the memory unit 1010, the ALU 1020, and/or the control unit 1030. For example, the memory unit 1010, the ALU 1020, and the control unit 1030 may be connected to each other through metal lines on a chip for direct communication therebetween. The memory unit 1010, the ALU 1020, and/or the control unit 1030 may be monolithically integrated on a single substrate to form a single chip. Input/output devices 2000 may be connected to the electronic device architecture (chip) 1000. The control unit 1030 may include processing circuitry such as hardware including logic circuits; a hardware/software combination such as a processor executing software; or a combination thereof. For example, the processing circuity more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. Similarly, though the electronic device architecture 1000 is illustrated as including the ALU 1020, the electronic device architecture 1000 is not limited, and may contain additional and/or alternative processing circuity. The memory unit 1010 may include a main memory and a cache memory. The electronic device architecture (chip) 1000 may be an on-chip memory processing unit.

The memory unit 1010, the ALU 1020, and/or the control unit 1030 may each independently include the above-described semiconductor devices. Referring to FIG. 8, a cache memory 1510, an ALU 1520, and a control unit 1530 may form a central processing unit (CPU) 1500, and the cache memory 1510 may include a static random access memory (SRAM). A main memory 1600 and an auxiliary storage 1700 may be provided apart from the CPU 1500. The main memory 1600 may include a dynamic random access memory (DRAM) including capacitors such as those described above.

In some cases, an electronic device architecture may be implemented in a form in which unit computing devices and unit memory devices are adjacent to each other on a single chip without sub-units.

Figure 10:
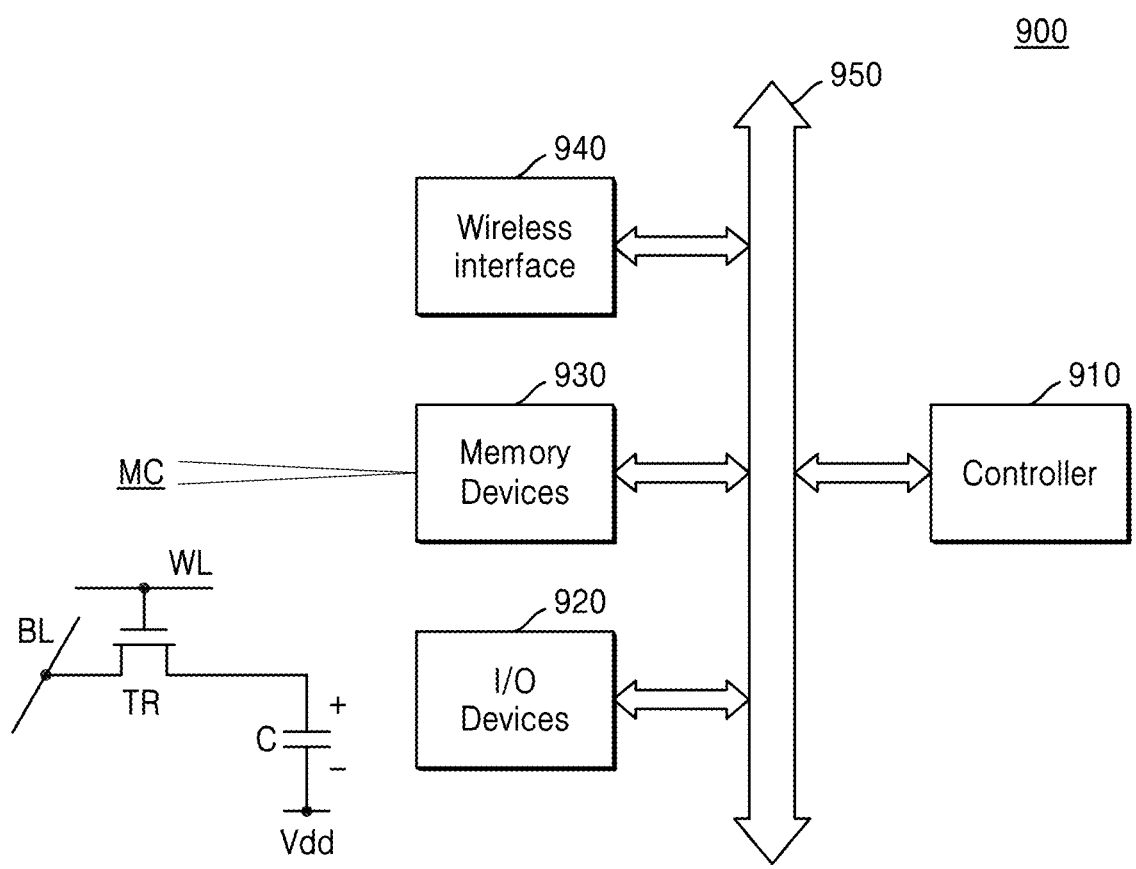
FIG. 10 is a schematic diagram for an electronic device including a capacitor according to some embodiments.

FIG. 10 is a schematic diagram for an electronic device including a capacitor according to some embodiments.

Referring to FIG. 10, an electronic device 900, according to some example embodiments, may be and/or may be included in a personal digital assistant (PDA), a laptop computer, a portable computer, a web tablet, a wireless phone, a mobile phone, a digital music player, a cable/wireless electronic device, etc., but is not limited thereto. The electronic device 900 may include a controller 910, an input/output (I/O) device 920 (e.g., a keypad, a keyboard and/or a display), a memory device 930, and a wireless interface unit 940 which are combined with each other through a data bus 950. For example, the controller 910 may include at least one of a microprocessor, a digital signal processor, a microcontroller, and/or other logic devices. The other logic devices may have a similar function to any one of the microprocessor, the digital signal processor, and/or the microcontroller. The memory device 930 may store, for example, commands performed by the controller 910. Additionally, the memory device 930 may also be used for storing a user data.

The controller 910 may be, for example, the same as and/or substantially similar to the central processing unit 1500 and/or the control unit 1530 (of FIG. 8) and/or the control unit 1030 (of FIG. 7). Similarly the I/O device 920 may be the same as and/or substantially similar to the input/output devices 2500 of FIG. 8.

The memory device 930 may include a plurality of memory cells MC. Each of the memory cells MC may include a capacitor C connected to a transistor TR. For example, the transistor TR and/or the capacitor C may be, respectively, the same as and/or substantially similar to the field effect transistor 10 and/or the capacitor 1 (of FIG. 3). A word line WL may be connected to a gate of the transistor TR. A bit line BL may be connected one source/drain region of the transistor TR and the capacitor C may be connected to the other source/drain region of the transistor TR. The other end of the capacitor C may be connected to a power supply voltage Vdd. The capacitor C may include any of the capacitors 1, 1', and/or 1" described in FIGS. 1, 3-6, and/or 9 of the present application.

The electronic device 900 may use the wireless interface unit 940 in order to transmit data to a wireless communication network communicating with a radio frequency (RF) signal or in order to receive data from the network. For example, the wireless interface unit 940 may include an antenna or a wireless transceiver.

In some cases, an electronic device architecture may be implemented in a form in which unit computing devices and unit memory devices are adjacent to each other on a single chip without sub-units.

As described above, according to the one or more of the above embodiments, dielectric layers having high permittivity and leakage current blocking/reducing characteristics, semiconductor devices including the dielectric layers, semiconductor apparatuses including the semiconductor devices may be provided. The semiconductor devices may have an improved degree of integration and may thus contribute to the miniaturization of electronic devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
   a first electrode;
   a second electrode which is apart from the first electrode; and
   a dielectric layer between the first electrode and the second electrode, the dielectric layer comprising
   a base material including an oxide of a base metal, the base material having a dielectric constant of about 20 to about 70, and
   co-dopants including a Group 3 element and a Group 5 element.

2. The capacitor of claim 1, wherein the Group 3 element comprises at least one of Sc, Y, B, Al, Ga, In, or Tl.

3. The capacitor of claim 1, wherein the Group 5 element comprises at least one of V, Nb, Ta, N, P, As, Sb, or Bi.

4. The capacitor of claim 1, wherein the base metal comprises at least of Hf, Zr, Pr, Nd, Gd, Dy, Yb, Pb, Zn, Ti, or Lu.

5. The capacitor of claim 1, wherein
the dielectric layer comprises a compound represented by $(A,B)_x C_y O_z$,
where A refers to the Group 3 element,
B is the Group 5 element,
C refers to the base metal, and the base metal comprises at least one of Hf, Zr, Pr, Nd, Gd, Dy, Yb, Pb, Zn, Ti, or Lu, and
$x+y+z=1$, $0<x\leq0.2$, and $0<y\leq0.5$.

6. The capacitor of claim 1, wherein at least one of the Group 3 element or the Group 5 element comprises d-orbitals.

7. The capacitor of claim 1, wherein the Group 3 element comprises at least one of Sc, Y, or a combination thereof.

8. The capacitor of claim 1, wherein the Group 5 element comprises at least one of V, Nb, Ta, or a combination thereof.

9. The capacitor of claim 1, wherein
the Group 3 element is included in an amount greater than about 0.0 at % to about 20.0 at % based on all the co-dopants and metals of the dielectric layer, and
the Group 5 element is included in an amount greater than about 0.0 at % to about 20.0 at % based on all the co-dopants and the metals of the dielectric layer.

10. The capacitor of claim 1, wherein the dielectric layer has an energy band wider than an energy band of the base material.

11. The capacitor of claim 1, wherein the dielectric layer comprises at least one dopant pair in which the Group 3 element and the Group 5 element share an oxygen atom.

12. The capacitor of claim 11, wherein the at least one dopant pair comprises at least two dopant pairs, and a distance between the at least two dopant pairs is equal to or less than 6 times an ionic radius of the base metal.

13. The capacitor of claim 1, wherein the dielectric layer has a thickness of about 10 Å to about 100 Å.

14. The capacitor of claim 1, wherein the dielectric layer has a dielectric constant of about 40 or more.

15. The capacitor of claim 1, wherein a permittivity of the dielectric layer is greater than a permittivity of the base material by about 10% or more.

16. The capacitor of claim 1, wherein at least one of the co-dopants has a substitutional formation energy of less than about 0 for the base material.

17. The capacitor of claim 1, wherein at least one of the first electrode or the second electrode comprise a metal, a metal nitride, a metal oxide, or a combination thereof.

18. A semiconductor apparatus comprising:
    the capacitor of claim 1.

19. The semiconductor apparatus of claim 18, wherein the semiconductor comprises:
    a transistor; and
    a charge-storage device electrically connected to the transistor,
    wherein at least one of the transistor or the charge-storage device comprises the capacitor of claim 1.

20. The semiconductor apparatus of claim 18, wherein
the capacitor of claim 1 is included in a transistor,
the first electrode includes a channel region between a source and a drain,
the second electrode is a gate electrode, and
the dielectric layer is a gate insulating layer.

* * * * *